US011561253B2

(12) United States Patent
Tajima et al.

(10) Patent No.: US 11,561,253 B2
(45) Date of Patent: Jan. 24, 2023

(54) PRODUCTION MANAGEMENT APPARATUS (71) Applicant: FUJI CORPORATION, Chiryu (JP)

(72) Inventors: Michihiko Tajima, Nagoya (JP); Teruyuki Ohashi, Anjo (JP); Tetsuya Kako, Nagoya (JP)

(73) Assignee: FUJI CORPORATION, Chiryu (JP)

( * ) Notice: Subject to any disclaimer, the term of this patent is extended or adjusted under 35 U.S.C. 154(b) by 369 days.

(21) Appl. No.: 16/956,893

(22) PCT Filed: Dec. 25, 2017

(86) PCT No.: PCT/JP2017/046468
§ 371 (c)(1),
(2) Date: Jun. 22, 2020

(87) PCT Pub. No.: WO2019/130398
PCT Pub. Date: Jul. 4, 2019

(65) Prior Publication Data
US 2021/0332969 A1 Oct. 28, 2021

(51) Int. Cl.
*G01R 31/26* (2020.01)
*H05B 45/54* (2020.01)
(Continued)

(52) U.S. Cl.
CPC ........ *G01R 31/2635* (2013.01); *H01L 33/486* (2013.01); *H05B 45/54* (2020.01);
(Continued)

(58) Field of Classification Search
CPC .. H05K 13/0084; H05K 13/02; H05K 13/021; H05K 13/0409; H05K 13/0417;
(Continued)

(56) References Cited

U.S. PATENT DOCUMENTS 9,204,586 B2 * 12/2015 Kato ............... H05K 13/084
9,326,385 B2 * 4/2016 Nonomura ........ H01L 33/0095
2006/0056945 A1 * 3/2006 Daio ............... H05K 13/021
414/403

FOREIGN PATENT DOCUMENTS

JP 2013-232458 A 11/2013

OTHER PUBLICATIONS

International Search Report dated Apr. 3, 2018 in PCT/JP2017/046468 filed Dec. 25, 2017.

* cited by examiner

*Primary Examiner* — Peter Dungba Vo
*Assistant Examiner* — Joshua D Anderson
(74) *Attorney, Agent, or Firm* — Oblon, McClelland, Maier & Neustadt, L.L.P.

(57) ABSTRACT

There is provided a production management apparatus including: a memory section configured to memorize component data in which ranks of LED components stored in the stocker are associated with identification information of the LED components; a rank input section configured to accept a rank of the LED component in the LED components of the multiple types as a designated rank, the LED component being used in producing the board product; and a component group generating section configured to generate a component group into which the LED components of the multiple ranks including the designated rank are combined so as to satisfy a required specification of the board product, based on the ranks of the LED components which are included in the component data.

19 Claims, 8 Drawing Sheets (51) Int. Cl.
*H01L 33/48* (2010.01)
*H05K 13/00* (2006.01)
*H05K 13/04* (2006.01)
*H05K 13/08* (2006.01)

(52) U.S. Cl.
CPC ..... *H05K 13/0084* (2013.01); *H05K 13/0409* (2018.08); *H05K 13/086* (2018.08)

(58) Field of Classification Search
CPC ............ H05K 13/0434; H05K 13/085; H05K 13/0857; H05K 13/086; H05K 13/087; H05K 13/0882; Y10T 29/4913; Y10T 29/53174; Y10T 29/53178; Y10T 29/53183; Y10T 29/53191; H05B 45/50; H05B 45/52; H05B 45/54; G05B 19/41805; G05B 19/41865; G05B 2219/36195
See application file for complete search history.

[TABLE 1] PRODUCTION PLAN M1

| PRODUCTION TYPE | PLANNED PRODUCTION VOLUME |
|---|---|
| U1 | T1 |
| U2 | T2 |
| U3 | T3 |
| ⋮ | ⋮ |

[TABLE 2] PRODUCT DATA M2

| | REQUIRED SPECIFICATION | | |
|---|---|---|---|
| | COLOR | BRIGHTNESS | FORWARD VOLTAGE |
| U1 | C11–C15 | B11–B15 | Vf11–Vf15 |
| U2 | C21–C25 | B21–B25 | Vf21–Vf25 |
| U3 | C31–C35 | B31–B35 | Vf31–Vf35 |
| ⋮ | ⋮ | ⋮ | ⋮ |

[TABLE 3] COMPONENT DATA

| TYPE | IDENTIFICATION INFORMATION(ID) | RANK (COLOR; BRIGHTNESS; FORWARD VOLTAGE) | STOCK VOLUME | STOCK RATIO | EXPIRY DATE |
|---|---|---|---|---|---|
| A | Px01 | Rx-TF01 (C13: B12 : Vf12) | St01 | Rs01 | Dx01 |
| A | Px02 | Rx-TF02 (C12: B13 : Vf14) | St02 | Rs02 | Dx02 |
| A | Px03 | Rx-TF03 (C13: B14 : Vf11) | St03 | Rs03 | Dx03 |
| A | Px04 | Rx-TF04 (C15: B13 : Vf13) | St04 | Rs04 | Dx04 |
| ⋮ | ⋮ | ⋮ | ⋮ | ⋮ | ⋮ |

Fig. 3

[TABLE 1] CONTROL PROGRAM

| MOUNTING COORDINATES | | MOUNTING ANGLE | REFERENCE CODE | |
|---|---|---|---|---|
| X-Axis COORDINATE | Y-Axis COORDINATE | | | |
| X11 | Y11 | $\theta 1$ | Ref1 | ⎫ FIRST COMPONENT ROW |
| X12 | Y11 | $\theta 2$ | Ref2 | |
| X13 | Y11 | $\theta 3$ | Ref3 | |
| X14 | Y11 | $\theta 4$ | Ref4 | ⎭ |
| X11 | Y12 | $\theta 1$ | Ref4 | ⎫ SECOND COMPONENT ROW |
| X12 | Y12 | $\theta 2$ | Ref1 | |
| X13 | Y12 | $\theta 3$ | Ref2 | |
| X14 | Y12 | $\theta 4$ | Ref3 | ⎭ |
| X11 | Y13 | $\theta 1$ | Ref3 | ⎫ THIRD COMPONENT ROW |
| X12 | Y13 | $\theta 2$ | Ref4 | |
| ⋮ | ⋮ | ⋮ | ⋮ | |

[TABLE 2] PRODUCT TYPE TO CORRESPONDING DATA

| PRODUCT TYPE | USABLE NUMBERS | CORRESPONDING DATA |
|---|---|---|
| U1 | ALL | BOM1 |
| U2 | 1→M | BOM2 |
| | M+1→T2 | BOM3 |
| U3 | ALL | BOM4 |
| ⋮ | ⋮ | ⋮ |

[TABLE 3] BOM

| REFERENCE CODE | IDENTIFICATION INFORMATION(ID) | RANK |
|---|---|---|
| Ref1 | Px01 | Rx-TF01 |
| Ref2 | Px02 | Rx-TF02 |
| Ref3 | Px05 | Rx-TF05 |
| Ref4 | Px07 | Rx-TF07 |
| ⋮ | ⋮ | ⋮ |

— BOM2
— BOM3
— BOM1

| COMPONENT GROUPS | PRODUTION CAPABILITIES | REQUIRED SPECIFICATION | PRIORITY CONDITION | | | DEGREE OF AVERAGE | SET-UP WORKLOAD | QUALITY |
|---|---|---|---|---|---|---|---|---|
| | | | STOCK VOLUME | STOCK RATIO | EXPIRY DATE | | | |
| Gr01 | Np01 | ○ | ○ | △ | ◎ | ○ | 2 | ◎ |
| Gr02 | Np02 | ○ | △ | ○ | ○ | NG | 2 | ○ |
| Gr03 | Np03 | ○ | NG | △ | ○ | NG | 4 | ○ |
| ⋮ | ⋮ | ⋮ | ⋮ | ⋮ | ⋮ | ⋮ | ⋮ | ⋮ |
| GrN | NpN | ○ | ○ | ○ | NG | ○ | 3 | ○ |
| GrN+1 | NpN+1 | NG | — | — | — | — | — | — |
| ⋮ | ⋮ | ⋮ | ⋮ | ⋮ | ⋮ | ⋮ | ⋮ | ⋮ |

| CANDIDATE PATTERNS | COMPONENT GROUPS | PRODUCTION CAPABILITIES | PRIORITY |
|---|---|---|---|
| Pt1 | Gr02<br>Gr03 | Np23 | 1 |
| Pt2 | Gr02<br>Gr05<br>Gr07 | Np25 | 2 |
| Pt3 | Gr02<br>Gr07<br>Gr08 | Np27 | 3 |
| ⋮ | ⋮ | ⋮ | ⋮ |

PRODUCTION MANAGEMENT APPARATUS

TECHNICAL FIELD

The application relates to a production management apparatus.

BACKGROUND ART

A production management apparatus manages a component mounting machine for producing board products by mounting multiple LED components on a board, and also manages a stocker for storing multiple types of LED components to be replenished to the component mounting machine. LED components tend to vary in color, brightness, and forward voltage during the manufacturing process, which needs to rank the LED components accordingly. Then, board products are often produced by combining LED components, which are ranked into multiple types, with satisfying the required specifications that are determined according to their applications and functions. Patent Literature 1 discloses a configuration in which combinations of ranks of ranked LED components are selected according to an estimated number of board products to be produced.

PATENT LITERATURE

Patent Literature 1: JP-A-2013-232458

BRIEF SUMMARY

Technical Problem

Incidentally, production of board products may often be affected by costs of ranked LED components and distributing conditions thereof. In this regards, in producing board products, a production management apparatus is required to control the production of board products, for example, prioritize LED components belonging to a specific rank for being used, or spending LED components of various ranks in a balanced manner according to their stock states in the stocker. Additionally, in producing board products, there is a demand for improving efficiency in involved various production processes including a preparatory setup for production.

An object of the present disclosure is to provide a production management apparatus capable of improving production efficiency while enabling production of board products according to an existing situation.

Solution to Problem

According to the description, there is provided a first production management apparatus configured to manage a component mounting machine for producing a board product by mounting multiple LED components on a board and a stocker for storing multiple types of the LED components, the production management apparatus including: a memory section configured to memorize component data in which ranks of the LED components are associated with identification information of the LED components stored in the stocker; a rank input section configured to accept the rank of the LED component in the LED components of the multiple types as a designated rank, the LED component being used in producing the board product; and a component group generating section configured to generate a component group into which the LED components of the multiple ranks including the designated rank are combined so as to satisfy a required specification of the board product, based on the ranks of the LED components which are included in the component data.

According to the description, there is provided a second production management apparatus configured to manage a component mounting machine for producing a board product by mounting multiple LED components on a board and a stocker for storing multiple types of the LED components, the production management apparatus including: a memory section configured to memorize component data in which ranks of the LED components are associated with identification information of the LED components stored in the stocker; a component group generating section configured to generate multiple component groups into each of which the LED components of the multiple ranks are combined so as to satisfy a required specification of the board product based on the ranks of the LED components which are included in the component data; and a component group selection section configured to select multiple component groups from the multiple component groups generated so as to be combined for use in producing the board product based on a production capability of each of the multiple component groups which is calculated based on stock volumes of the LED components included in the component data and a planned production volume of the board product.

According to the description, there is provided a third production management apparatus configured to manage a component mounting machine for producing a board product by mounting multiple LED components on a board and a stocker for storing multiple types of the LED components, the production management apparatus including: a memory section configured to memorize component data in which ranks of the LED components are associated with identification information of the LED components stored in the stocker; a component group generating section configured to generate a component group into which the LED components of the multiple ranks are combined so as to satisfy a required specification of the board product based on the ranks of the LED components which are included in the component data; and a delivery command section configured to cause a delivery process of delivering the LED components to be executed in the stocker by informing the stocker of the identification information of the multiple LED components belonging to the component group generated by the component group generating section for use in producing the board product.

Advantageous Effects

According to the configuration of the first production management apparatus, the component group for use in producing the board product is generated so as to include the LED component of the designated rank. That is, one or multiple LED components which are designated by an operator or a manager of a production line are prioritized for being used for production. In addition, the other ranks are automatically combined based on the designated rank. Consequently, the production management apparatus can achieve an improvement in production efficiency while enabling the board product to be produced in the manner matching the current situations.

According to the configuration of the second production management apparatus, the multiple component groups can be used in producing the board product, and, for example, even in the case that any one of the component groups is not good enough alone for production due to the relationship with the stock volume, the production can be enabled. In addition, the LED components stocked in the stocker can be used in a well-balanced manner. Consequently, the production management apparatus can achieve an improvement in production efficiency while enabling the board product to be produced in the manner matching the current situations.

According to the configuration of the third production management apparatus, after the component group is generated for use in producing the board product, the delivery process of delivering the LED components belonging to the component group so generated is executed in the stocker. As a result, for example, when the operator or the automatic conveyance device carries out the LED components from the stocker, since the delivery process is executed, the operator or the automatic conveyance device can carry out the LED components efficiently with certainty. The production management apparatus can achieve an improvement in production efficiency while enabling the board product to be produced in the manner matching the current situations.

DESCRIPTION OF EMBODIMENTS

1. Embodiments
1-1. Summary of Production System 1

Figure 1:
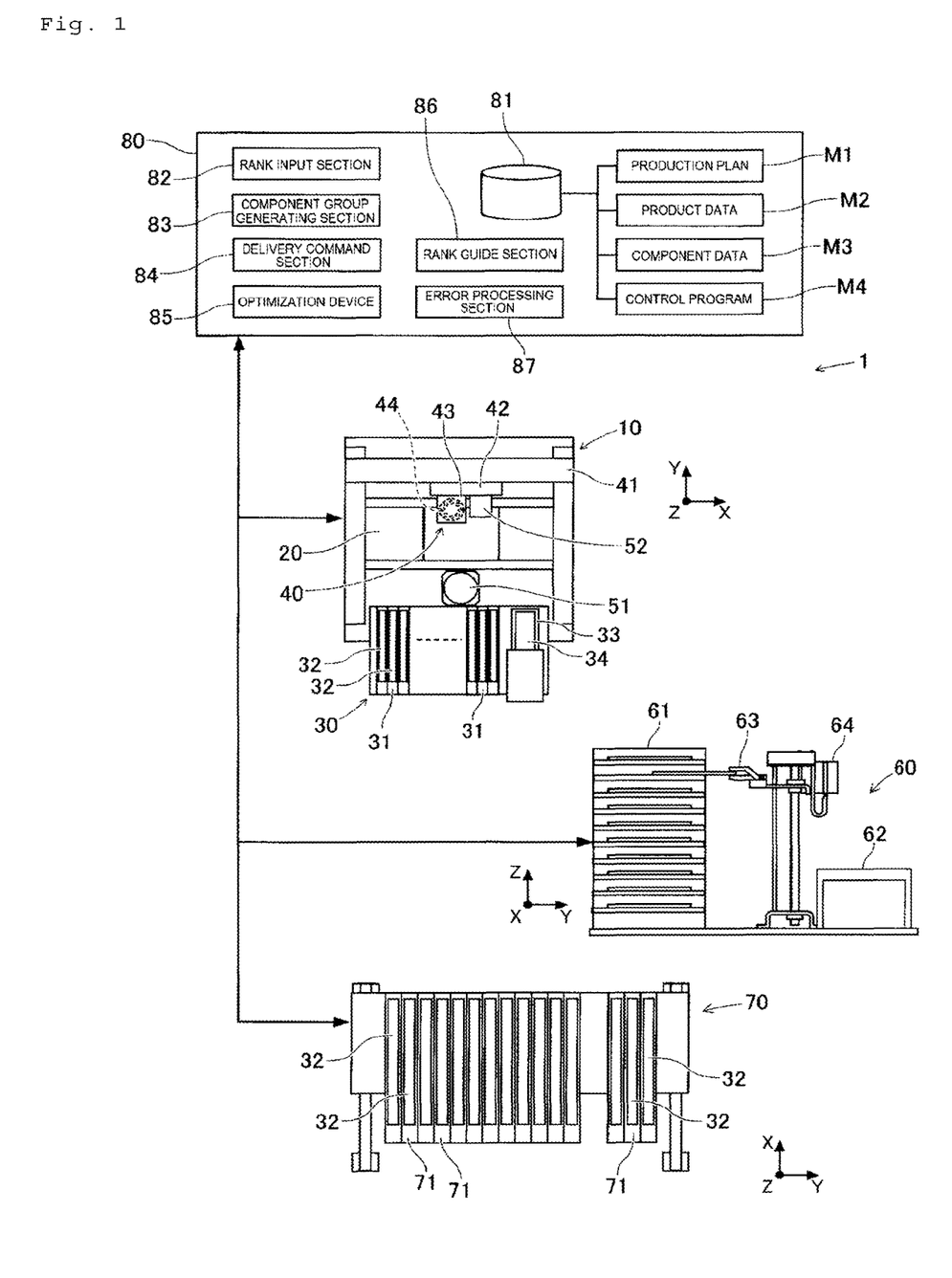
FIG. 1 is a block diagram showing a production system including a production management apparatus.

Production system 1 includes, as shown in FIG. 1, component mounting machine 10, stocker 60, preparation carriage 70, and production management apparatus 80. Component mounting machine 10 makes up a production line together with other boar work machines such as a solder printing machine, a reflow furnace, an inspection machine, and the like. Multiple such board work machines are connected not only to one another but also to a host computer (hereinafter, referred to as a "host PC"), which is incorporated in production management apparatus 80, for communication. In the production line, a board is conveyed sequentially to the multiple board work machines, so that a board product 90 (refer to FIG. 4) is produced which satisfies a predetermined required specification.

1-2. Configuration of Component Mounting Machine 10

Component mounting machine 10 fabricates board product 90 by mounting components including multiple LED components on a circuit board (hereinafter, referred to simply as a "board"). The "LED component" described above is a light emitting device configured to emit light by being supplied with electricity. Component mounting machine 10 includes board conveyance device 20, component supply device 30, component delivery device 40, part camera 51, and board camera 52. Board conveyance device 20 sequentially conveys boards in a conveyance direction using a belt conveyor.

Component supply device 30 has multiple feeders 32, which are set individually in multiple slots 31 in an exchangeable manner. Feeder 32 feeds and moves a carrier tape on which multiple components are stored to supply the components. Component supply device 30 supplies, for example, components of a relatively large size in such a state that the components are laid out on tray 34 placed on pallet 33.

Component delivery device 40 delivers a component supplied by component supply device 30 to a predetermined mounting position on a board conveyed into the component mounting machine by board conveyance device 20. Component delivery device 40 allows moving plate 42 to be moved in a horizontal direction by head driving device 41. Mounting head 43 is fixed to moving plate 42 in an exchangeable manner. Mounting head 43 supports suction nozzle 44 in such a manner as to move in a Z-axis direction and to turn around a θ-axis, which is parallel to the Z-axis direction. Suction nozzle 44 picks up a component through suction using supplied air of a negative pressure.

Part camera 51 and board camera 52 are a digital imaging device having an imaging device such as CMOS or the like. Part camera 51 is fixed to a base of component mounting machine 10 in such a manner as to image a component held by suction nozzle 44 from below. Board camera 52 is provided on moving plate 42 in such a manner as to image a board from above.

Component mounting machine 10 executes a mounting process of mounting components on a board. In the mounting process, component mounting machine 10 controls the operation of mounting head 43 configured to hold a component based on pre-generated control program M4 (refer to Table 1 in FIG. 3), information outputted from various types of sensors, and the results of a recognition process such as image processing. Control program M4 used in the mounting process is generated and optimized based on production plan M1, product data M2, and component data M3.

1-3. Configuration of Stocker 60

Stocker 60 stores components such as multiple types of LED components according to respective storage forms of the components. The storage forms of the components include a reel around which a carrier tape is wound, a tray, a stick, a bulk case, and the like. Stocker 60 includes storage shelves 61, working table 62, conveyance device 63, and display device 64. Storage shelves 61 stores components like LED components. Storage shelves 61 is formed according to storage forms of components to be stored. Storage shelves 61 is configured to store individual reels in a discriminating manner and holds reels in an aligned state.

Working table 62 is configured to enable a component or components which are put into or out of stocker 60 to be rested thereon temporarily. Working table 62 is used for transfer of components to and from the outside of stocker 60. Conveyance device 63 conveys a component between a predetermined storage position in storage shelves 61 and working table 62. In removing a component from storage shelves 61, conveyance device 63 grips, for example, a reel situated in a predetermined storage position and reads an identification code affixed to the reel to confirm whether the reel is a proper component to be removed. Thereafter, conveyance device 63 places the reel it grips on working table 62.

Display device 64 displays various types of information so as to be seen by an operator. Display device 64 displays, for example, identification information, types, ranks, expiry dates, stock volumes, or the like of components stored in storage shelves 61 according to an operation of the operator. Display device 64 is made up of a touch panel and functions as an input device for accepting various types of operations performed by the operator. Stocker 60 holds storage information denoting storage positions of various types of components stored in storage shelves 61. For example, in accepting or delivering a predetermined type of components, stocker 60 not only controls the operation of conveyance device 63 but also updates the storage information as required.

1-4. Configuration of Preparation Carriage 70

Preparation carriage 70 is configured to move between component mounting machine 10 and stocker 60. Preparation carriage 70 is loaded with replacement feeders 32 which are to be set in slots 31 of component supply device 30 in a preparatory setup necessary to execute a mounting process for production of a predetermined board product. As shown in FIG. 1, preparation carriage 70 has multiple slots 71. Multiple slots 71 are configured similar to multiple slots 31 of component supply device 30 to support replacement feeders 32.

Once set individually in multiple slots 71, replacement feeders 32 are electrically connected with preparation carriage 70, whereby when supplied with electricity from the outside, replacement feeders 32 become ready to be controlled accordingly. Preparation carriage 70 recognizes replacement feeders 32 which are now set individually in corresponding slots 71. Additionally, in loading a carrier tape on replacement feeder 32, preparation carriage 70 causes a reader (not shown) to read an identification code affixed to the reel so as to associate the carrier tape loaded on feeder 32 in question therewith.

As a result, feeder data, in which a feeder ID, which is identification information specific to feeder 32, is associated with a reel ID and components stored around a reel in feeder 32 in question, is generated or updated. Preparation carriage 70 transmits updated feeder data to the host PC when preparation carriage 70 causes feeder 32 in question to be associated with the components and when preparation carriage 70 cancels the association of feeder 32 in question with the components. Additionally, preparation carriage 70 holds loading information denoting feeders 32 set individually in corresponding slots 71. Preparation carriage 70 updates the loading information every time feeders 32 are loaded in and unloaded from corresponding slots 71.

1-5. Summary of Production Management Apparatus 80

Production management apparatus 80 has, as its management targets, component mounting machine 10, stocker 60, and preparation carriage 70 which make up the production line and is incorporated in the host PC which is connected with the relevant production line making up devices for communication. In this embodiment, board product 90, which is produced by component mounting machine 10, is made up by component mounting machine 10 mounting multiple LED components on a board. Board product 90 is produced so as to satisfy a required specification which is determined according to its application and function.

More specifically speaking, a required specification determined for board product 90 requires that the color and brightness of an LED component, and the voltage of a power supply circuit for applying a voltage to multiple LED components fall within their own tolerances or permissible ranges when board product 90 is in operation. Here, for example, even though multiple LED components, whose color coincides with a color specified in the required specification, are disposed according to a brightness specified in the required specification, the resulting brightness does not always satisfy the brightness specified in the required specification. This is because there is caused a variation in color, brightness, and forward voltage in LED components in the manufacturing process thereof.

To cope with this problem, board product 90 is produced by combining LED components of multiple ranks so that the synthesis of light emitted from the multiple LED components so combined satisfies the brightness specified in the required specification. The rank of an LED component is given according to its color, brightness, and forward voltage. In the case that a combination of LED components satisfying the required specification of board product 90 is determined in advance, production is not interrupted in any way, provided that LED components belonging to the combination can be secured.

However, due to the variation in color, brightness, and forward voltage caused in LED components during the production process thereof, there may be caused a possibility that it becomes difficult to acquire a predetermined rank of LED components. Additionally, in the event that the price of a predetermined rank of LED components is raised due to a small production volume thereof, there may be caused a possibility that the production cost of board product 90 is affected badly. To cope with these problems, it is considered that various ranks of LED components be stored in stocker 60.

However, LED components have their own determined expiry dates, and LED components whose expiry dates are past are discarded for disposal, which can eventually affect the production cost of board product 90. As a result, in the embodiment, in producing board product 90, production management apparatus 80 manages such that a specific rank of LED components are prioritized to be used, or various ranks of LED components are to be spent in a balanced manner depending upon the stock conditions of LED components in stocker 60.

1-6. Configuration of Production Management Apparatus 80

As shown in FIG. 1, production management apparatus 80 includes stocker 81, rank input section 82, component group generating section 83, delivery command section 84, optimization processing section 85, rank guide section 86, and error processing section 87. Storage section 81 is made up of a hard disk or a flash memory. Storage section 81 stores production plan M1, product data M2, component data M3, control program M4, and the like.

Figure 2:
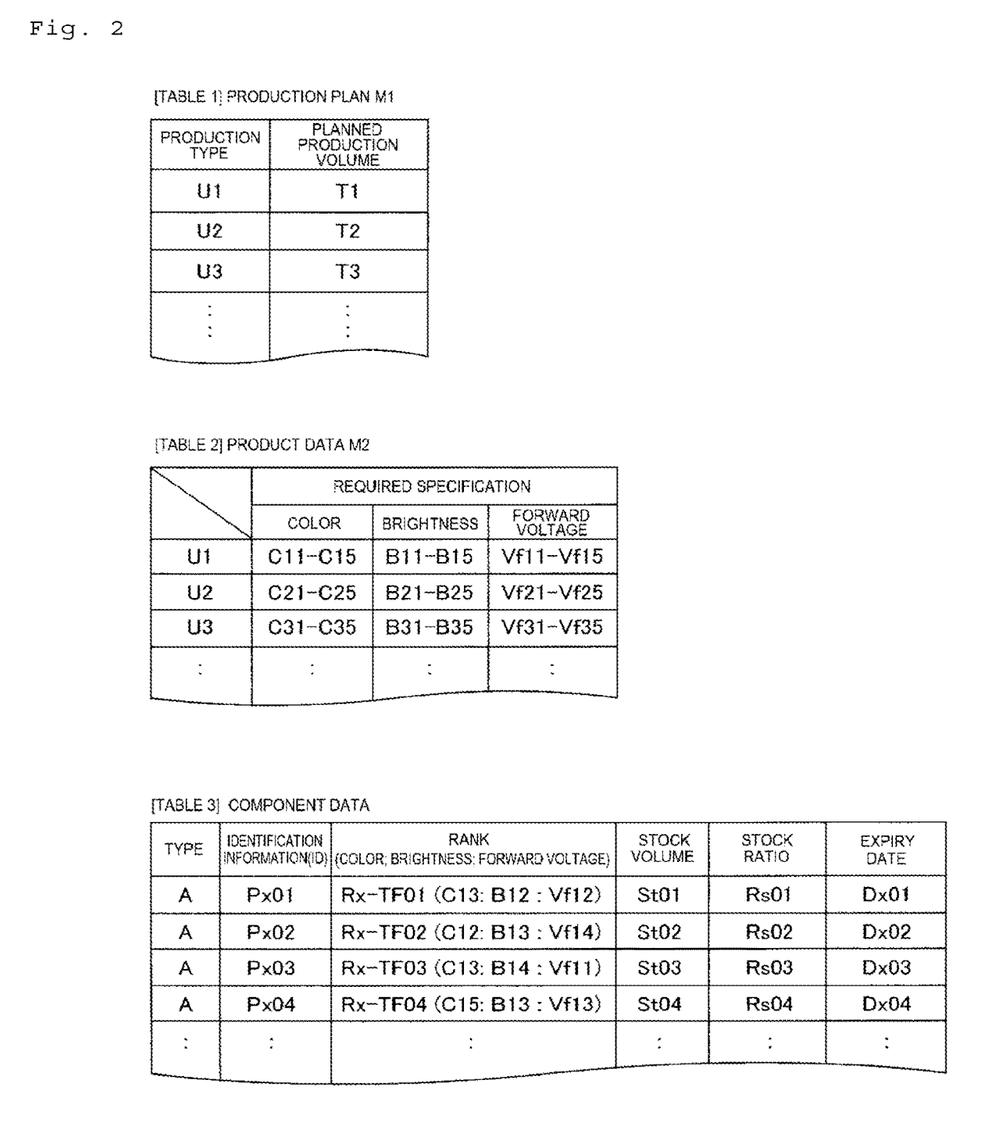
FIG. 2 shows charts depicting a production plan, product data, and component data, respectively.

Production plan M1 is information denoting planned production volumes for multiple types of products which are planned to be produced, as shown in Table 1 in FIG. 2. Product data M2 is information in which required specifications (acceptable ranges of color, brightness, forward voltage) for board products 90 are recorded for the multiple types of products, as shown in Table 2 in FIG. 2. Component data M3 is information in which a stock volume, a stock ratio, and an expiry date as well as a rank are associated with identification information (ID) of individual LED components, as shown in Table 3 in FIG. 2. Here, the "stock ratio" denotes a ratio of a stock volume of a component to a total stock volume of components of the same type.

Figure 3:
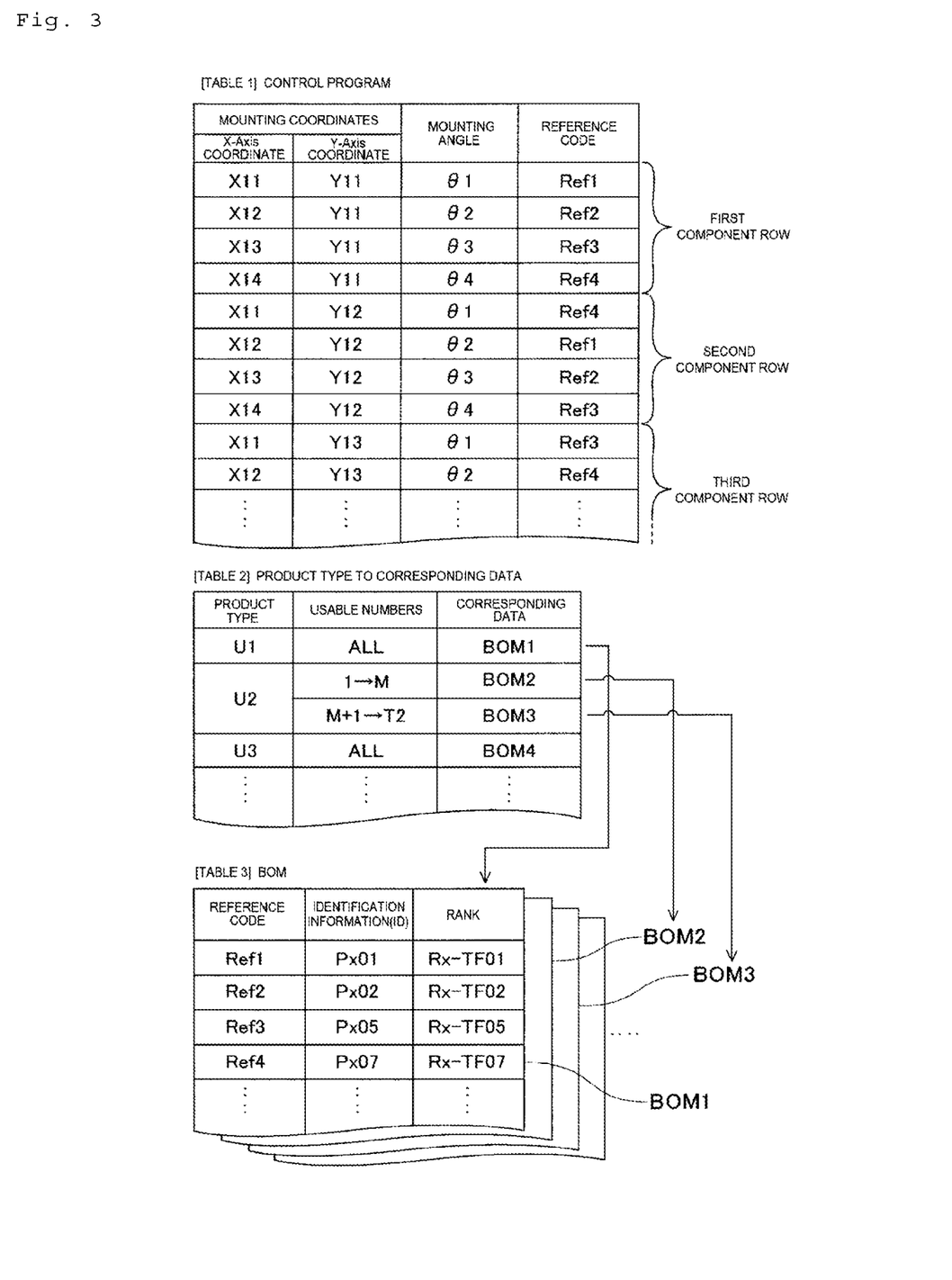
FIG. 3 shows charts depicting a control program, a product type—corresponding data relationship, and BOM, respectively.

Control program M4 is such that a mounting angle and a reference code of an LED component are associated with a mounting position (coordinates) of the LED component, as shown in Table 1 in FIG. 3. The mounting coordinates (X-axis coordinate (X11, X12, X13, X14, . . . ), Y-axis coordinate (Y11, Y12, . . . )) are values denoting a position where an LED component is mounted on a board. The mounting angle (a θ-axis angle (θ1, θ2, θ3, θ4, . . . )) of an LED component is a value denoting the angle of the LED component at the mounting coordinates. The reference code (Ref1, Ref2, Ref3, Ref4, . . . ) is a code commanding a reference to the rank of an LED component which is to be mounted at the mounting coordinates.

Here, one or multiple corresponding data (BOM (Bills of Materials)1, BOM2, BOM3, . . . ) are associated individually with multiple types of products (U1, U2, . . . ) according to a product type to corresponding data relationship as shown in Table 2 in FIG. 3. The multiple corresponding data (BOM1, BOM2, . . . ) are data in which the identification information (Px01, PX02, . . . ) and the ranks (Rx-TF01, Rx-TF02, . . . ) of the LED components are associated with the reference codes, as shown in Tables 3 and 4.

As a result, for example, the LED component (identification information: Px01, rank: Rx-TF01) associated with reference code Ref1 associated, in turn, with corresponding data BOM1 is mounted in the mounting position (X11, Y11) of first product type U1. According to the configuration described above, the ranks of the LED components which are mounted on board product 90 can be managed by changing the corresponding data (BOM1, BOM2, . . . ) in accordance with the product type of board product 90, the stock status of the LED components, or the like.

Rank input section 82 accepts the rank of an LED component which is selected for use in producing board product 90 from the multiple types of LED components, as a designated rank. Note that multiple ranks may be designated as long as LED components which are combined into the ranks so designated satisfy the required specifications. As a method for designating a rank as a designated rank, there can be adopted various forms in addition to a form in which a manager inputs the rank of an LED component to be designated directly or a form in which the manager selects the rank of an LED component to be designated from a list.

Specifically, when an LED component is designated as being used to produce board product 90, rank input section 82 adopts the rank of the LED component as one designated rank. According to the configuration described above, rank input section 82 regards the designation of an LED component for use in producing board product 90 as the designation of the rank thereof.

In the preparatory setup for production of board product 90, in the case that an LED component is associated with a feeder 32 for use in supplying the LED component, rank input section 82 regards the rank of the LED component as one designated rank. That is, for example, when a predetermined carrier tape is loaded in feeder 32 in preparation carriage 70 and feeder 32 in question and the LED component are associated with each other, rank input section 82 regards this as the designation of the rank thereof.

Further, in the preparatory setup for production of board product 90, when an LED component is set in component mounting machine 10 for supply, rank input section 82 regards the rank of the LED component as one designated rank. That is, for example, when feeder 32 loaded with a predetermined carrier tape is set in slot 31 in component supply device 30, rank input section 82 regards this as the designation of the rank of an LED component stored in feeder 32 in question.

In addition, when rank input section 82 accepts a set stock volume, stock ratio, or expiry date of an LED component as a condition of an LED component which is prioritized for being used in production of board product 90, rank input section 82 regards the rank of an LED component of high priority which is indexed based on component data M3 as one designated rank. Specifically speaking, if the manager desires to prioritize for spending an LED component whose stock volume is large, an LED component whose stock ratio is high, or an LED component whose expiry date is short, then the manager sets these conditions for the LED component. Then, rank input section 82 regards this as designation of a rank satisfying the condition.

With the designation method described above, an LED component to be used for production can be inputted as a designated rank without a direct designation of a rank by the operator. Additionally, in the case that a rank is designated by setting a condition in the way described above, the operator or the like does not have to specify an LED component whose stock volume in stocker 60 is large but can instead input a designated rank for the LED component so that the LED component is used for reference for production. Thus, not only preparatory setup efficiency can be improved, but also an erroneous input of a designated rank can be prevented.

Component group generating section 83 generates a component group into which multiple ranks of LED components are combined based on the ranks of LED components included in component data M3 so as to satisfy the required specification of board product 90. The "component group" is made up of a part or a whole of multiple LED components which are mounted on a board. In the case that board product 90 is made up of multiple component groups, board product 90 is such that the synthesis of light emitted from multiple LED components belonging to the multiple component groups satisfies the required specification when board product 90 is in operation.

In this embodiment, component group generating section 83 generates a component group into which multiple LED components including a designated rank are combined so as to satisfy the required specification of board product 90. For example, in the case that a component group is made up of N Led components, when one rank is designated by rank input section 82, component group generating section 83 determines remaining (N-1) LED components while including the designated rank. As a result, in producing board product 90, one or multiple LED components designated by the manager or the like are prioritized for being used.

Component group generating section 83 can adopt various forms as a component group generating method. A "generation of a component group", which will be described below, includes a form in which multiple component groups are generated as candidates for use in producing board product 90, and one preferred component group is selected from the candidates. In the case that component group generating section 83 accepts a stock volume, a stock ratio, or an expiry date of an LED component as a condition of an LED component which is prioritized for being used in producing board product 90, component group generating section 83 may generate a component group so as to include an LED component of high priority which is indexed based on component data M3.

For example, in the case that the operator desires to consume first an LED component whose stock volume is large, the operator sets this large stock volume as a condition. Then, component group generating section 83 generates a component group by combining a rank differing from the designated rank with a rank of the LED component whose stock volume is large. With the configuration described above, the operator can generate a component group without designating directly an LED component other than the LED component whose rank is designated. Additionally, the operator can generate a component group enabling an LED component whose stock volume in stocker 60 is large to be prioritized for being used in producing board product 90 without specifying the relevant LED component or the like.

Further, component group generating section 83 may generate a component group based on a planned production volume of board product 90 and component data M3 so that respective stock volumes of LED components stored in stocker 60 can be averaged when the planned production volume of board product 90 is achieved. With the configuration described above, since the respective stock volumes of the LED components remaining stocked in stocker 60 can be averaged after the planned production of board product 90 is achieved, the degree of freedom in generating a component group is increased for a subsequent production, and various types of board products 90 can still be produced subsequently.

Furthermore, component group generating section 83 may generate a component group so that the group includes LED components which are set in component mounting machine 10 in such a manner as to be supplied. With the configuration described above, LED components which have already been set in component mounting machine 10 are prioritized for being used in producing board product 90. As a result, since only LED components considered to be stocked less in stocker 60 have to be set or replenished in component supply device 30 of component mounting machine 10, the set-up workload required for preparatory setup can be reduced. As a result, the time required for preparatory setup can be reduced, and the production efficiency can be improved.

Further, component group generating section 83 may generate a component group so that the required specification of board product 90 is satisfied and the quality of board product 90 is increased which is based on the color and brightness of board product 90, as well as the voltage of the power supply circuit for applying a voltage to multiple LED components when board product 90 is in operation. For example, in the case that there is little difference in superiority or inferiority between multiple component groups generated by component generating section 83 from the viewpoint of production efficiency, in the event that a component group can be selected which enables the required specification of board product 90 to approach an ideal specification, the quality of board product 90 can be improved.

Delivery command section 84 informs stocker 60 of identification information of multiple LED components belonging to the component group generated by component group generating section 83 for use in producing board product 90, causing stocker 60 to deliver the relevant LED components. As a result, for example, when the operator receives an LED component delivered from stocker 60, since the delivery process has been executed, the operator can carry the relevant LED component in an efficient and secured manner. Production management apparatus 80 can achieve an improvement in production efficiency while enabling the production of a board product to be executed in a manner matching the current situations.

In this embodiment, when stocker 60 is informed of the identification information of an LED component to be delivered from delivery command section 84, stocker 60 executes a process of conveying an LED component corresponding to the identification information from storage shelves 61 to working table 62. With the configuration described above, stocker 60 executes the automatic LED component dispensing process as the delivery process. As a result, the operator or the like can receive the LED component carried out to the working table.

Optimization processing section 85 optimizes mounting positions, on a board, of multiple LED components belonging to the component group generated by component group generating section 83 for use in producing board product 90 based on the ranks of the multiple LED components. Here, the required specification of board product 90 is satisfied by mounting the multiple LED components belonging to the generated component group on the board. However, since the LED components of the different ranks are used for production, there may be generated a slight deviation in color or brightness of synthesized light, for example. Then, the deviation can be reduced by optimizing the mounting positions of the multiple LED components to thereby improve the quality of board product 90.

Figure 4:
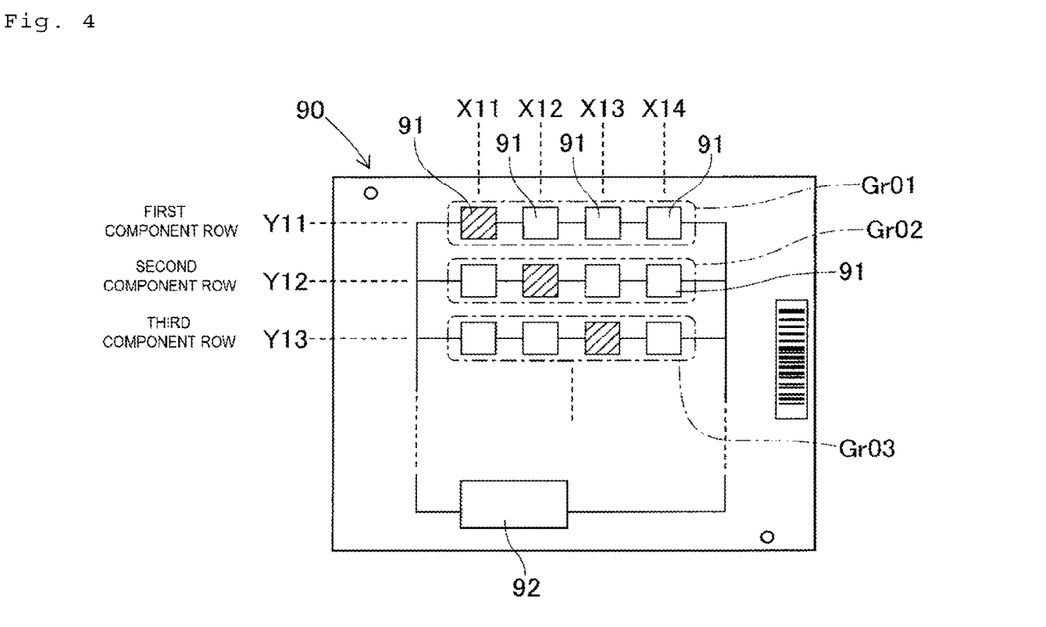
FIG. 4 is a plan view of a board product showing a part thereof.

Here, in this embodiment, board product 90 is made up by connecting component rows in parallel to one another, each of the component rows including LED components 91 of multiple ranks which are connected in series, as shown in FIG. 4. In this case, regarding one component row as one component group, optimization processing section 85 may execute the optimization by exchanging mounting positions of the LED components in each of the multiple component rows. Further, optimization processing section 85 may execute the optimization by exchanging the mounting positions of the multiple LED components in the adjacent component rows so that the ranks of the LED components differ in order row by row. The optimization process will be described in detail later.

As a guide, rank guide section 86 informs the operator, who is involved in the work relating to production of board product 90, of the ranks of the multiple LED components belonging to the component group generated by component group generating section 83 for use in producing board product 90. Specifically speaking, rank guide section 86 causes rank information denoting the ranks of the multiple LED components to be displayed on a control panel (not shown) of component mounting machine 10, display device 64 of stocker 60, and a terminal carried by the operator. This makes it possible to confirm whether for example, LED components dispensed from stocker 60, LED components set in component mounting machine 10 for supply, and the like are LED components suitable for production of board product 90. As a result, the preparatory setup can be performed accurately, thereby improving the work efficiency.

In starting the production of board product 90, error processing section 87 executes an error process in the event that all the multiple LED components belonging to the component group for use in producing board product 90 are not set in component mounting machine 10 for supply. As the error process, error processing section 87 prohibits component mounting machine 10 from mounting LED components or issues a warning to the operator who is involved in the work relating to production of board product 90. With the configuration described above, the error process is executed in the event that LED components are set insufficiently or incompletely in component mounting machine 10 for starting the production of board product 90. As a result, an error in which an erroneous LED component is mounted can be prevented from occurring.

1-7. Production Management Process

Referring to FIGS. 2 to 6, a production management process carried by production management apparatus 80 described above will be described. Here, component mounting machine 10 plans to produce next a board product of product type U1 (Table 1 in FIG. 2). Board product 90 of product type U1 is, as shown in FIG. 4, made up by connecting component rows in parallel to one another, each of the component rows including multiple LED components 91 which are connected in series. In this embodiment, each component row is made up of four LED components 91, whose ranks are classified into two to four types.

Power supply circuit 92 applies a voltage to multiple LED components 91. With this configuration, a voltage is applied equally to the multiple component rows which are connected in parallel to one another when board product 90 is in operation. Production management apparatus 80 regards one component row as one component group Gr. Production management apparatus 80 executes a production management process shown in FIG. 5 when starting the production of board product 90 of product type U1.

Figure 5:
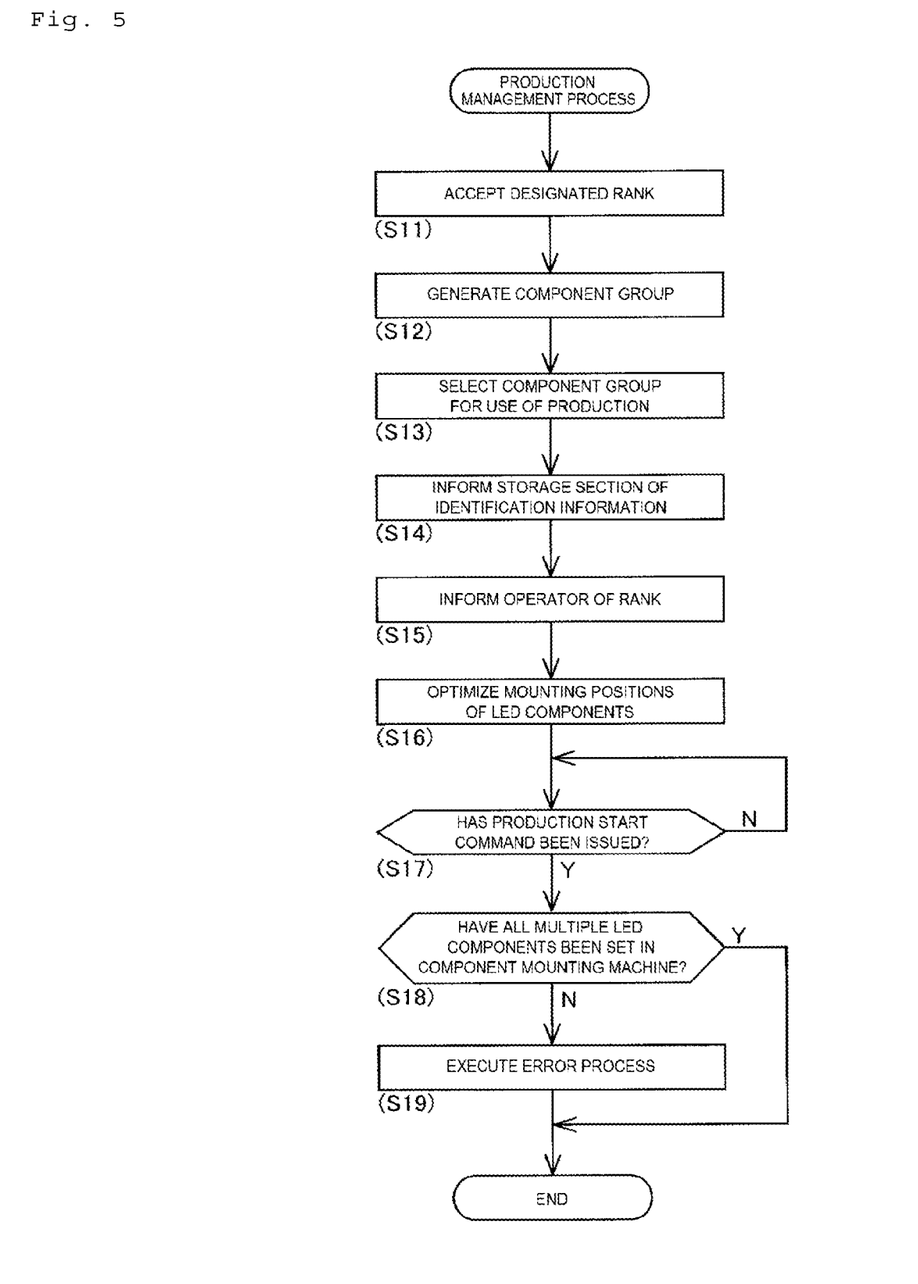
FIG. 5 is a flow chart showing a production management process.

Firstly, production management apparatus 80 accepts a designated rank (step 11, (hereinafter, a "step" will be referred to as "S".)) As described above, when the rank of LED component 91 is inputted or selected from the list, rank input section 82 regards them as the designation of the rank of LED component 91 in question. For example, when feeder 32 loaded with a predetermined carrier tape is set in slot 31 of component supply device 30, rank input section 82 acquires identification information and a rank of LED component 91 based on feeder data of feeder 32 so set in slot 31. Rank input section 82 inputs the rank as a designated rank.

Next, component group generating section 83 executes a generating process of component group Gr (S12). Here, component group generating section 83 generates multiple component groups Gr into each of which multiple LED components 91 including the designated rank are combined as candidates for use in producing board product 90 (refer to FIG. 6). For example, when one rank is inputted as a designated rank in one component row made up of four LED components 91, component group generating section 83 sets ranks for remaining three LED components 91 based on component data M3.

Figure 6:
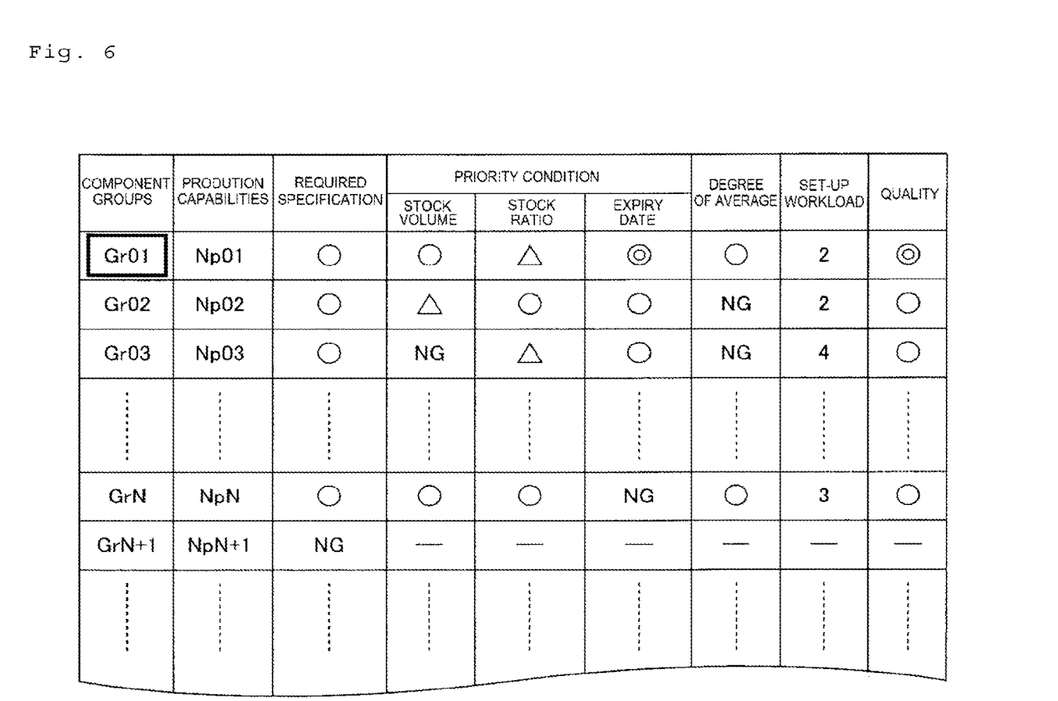
FIG. 6 is a chart depicting generated multiple component groups

Here, as shown in FIG. 6, in multiple component groups (Gr1, Gr2, . . . , GrN, GrN+1, . . . ) generated as usable candidates, some component groups (Gr1 to GrN) assume to satisfy the required specification of board product 90 of product type U1. Component group generating section 83 selects one preferred component group from the component groups (Gr1 to GrN) that satisfy the required specification based on any one or a combination of some of the priority condition (stock volume, stock ratio, expiry date), the degree of average denoting the degree of averaging the stock volume after production, the preparatory setup workload, and the quality of board product 90 (S13). Here, let's assume that component group Gr1, which is highlighted by a thick frame in FIG. 6, is selected.

Subsequently, delivery command section 84 informs stocker 60 of identification information (Px01, Px02, Px05, Px07) of the multiple LED components 91 belonging to the component group Gr1 generated by component group generating section 83 for use in producing board product 90 (S14). Stocker 60, which has so received the identification information, executes a delivery process of conveying LED components 91 corresponding to the identification information from storage shelves 61 to working table 62. As a result, reels, which are to be delivered from stocker 60, are conveyed to working table 62.

Further, rank guide section 86 causes the identification information of LED components 91 to be displayed on the control panel of component mounting machine 10 and display device 64 of stocker 60 to thereby inform the operator of the ranks as a guide (S15). As a result, the operator can verify whether LED components 91 stored in the reel conveyed from storage shelves 61 to working table 62 are LED components 91 suitable for production by collating identification information and ranks of LED components affixed to the reel with the identification information and ranks displayed on display device 64. Thereafter, the operator pulls a carrier tape out of the reel delivered and loads the carrier tape in feeder 32 at, for example, preparation carriage 70. As a result, the LED components 91 are associated with feeder 32 in question, and the feeder data is updated.

In addition, optimization processing section 85 optimizes mounting positions, on a boar, of the multiple LED components 91 belonging to the component group Gr1 for use in producing board product 90 based on the rank of the multiple LED components 91 (S16). Specifically speaking, optimization processing section 85 executes the optimization by exchanging the mounting positions of the LED components 91 in each of the multiple component rows corresponding to component group Gr1. Further, optimization processing section 85 executes the optimization by exchanging the mounting positions of multiple LED components 91 in the adjacent component rows so that the ranks of LED components 91 differ in order row by row.

Here, when component group Gr1 is generated as described above, corresponding data BOM1 applicable for product type U1 is determined. Then, optimization processing section 85 executes the optimization so as to substantially exchange the mounting positions by exchanging the reference codes (Ref1 to Ref4) in control program M4 as required. Specifically speaking, as shown in Table 1 in FIG. 3, LED components 91 whose ranks correspond, in order, to the reference codes (Ref1, 2, 3, 4) are disposed in a first component row (X11 to X14, Y11) of board product 90.

Then, LED components whose ranks correspond, in order, to the reference codes (Ref4, 1, 2, 3) are disposed in a second component row (X11 to X14, Y12) of board product 90. Similarly, optimization processing section 85 executes the optimization by rotating the reference codes in terms of order in subsequent component rows. As a result, in the adjacent component rows of board product 90, as shown in FIG. 4, LED components 91 whose ranks are designated (shaded with oblique lines in FIG. 4) are disposed such as to be offset one LED component from one another.

Production management apparatus 80 determines whether a command commanding a start of production has been inputted after the completion of a preparatory setup necessary for production of board product 90 (S17). If no command commanding a start of production has been inputted (S17: No), production management apparatus 80 waits until such a command is inputted. If a command commanding a start of production is inputted (S17: Yes), in starting to produce board product 90, production management apparatus 80 determines whether all the multiple LED components 91 belonging to component group Gr1 for use in production of board product 90 are set in component supply device 30 of component mounting machine 10 for supply (S18).

If all the multiple LED components 91 belonging to component group Gr1 are not set (S18: No), error processing section 87 executes an error process (S19). Specifically speaking, as the error process, error processing section 87 not only prohibits component mounting machine 10 from mounting LED components 91 stored then therein but also issues a warning to the operator. As a result, the operator takes countermeasure action such as setting proper LED components 91 in component mounting machine 10.

If all the multiple LED components 91 belonging to component group Gr1 are set properly (S18: Yes), or if a proper countermeasure action is taken after the error process is executed, production management apparatus 80 permits component mounting machine 10 to execute the mounting process of mounting the LED components 91 stored then therein on a board. Thereafter, production management apparatus 80 ends the production management process.

2. Variation of the Embodiment 2-1. Production Using Multiple Component Groups

In the embodiment, the rank of LED component 91 for use in production of board product 90 is accepted as the designated rank by the manager or the like (S11). On the contrary to this, production management apparatus 80 may be configured to generate multiple component groups for use in production of board product 90 by omitting the acceptance of a designated rank. That is, in this variation, in production of board products 90 of the same product type, component groups for use for production are configured to be changed within a planned production volume.

Figure 7:
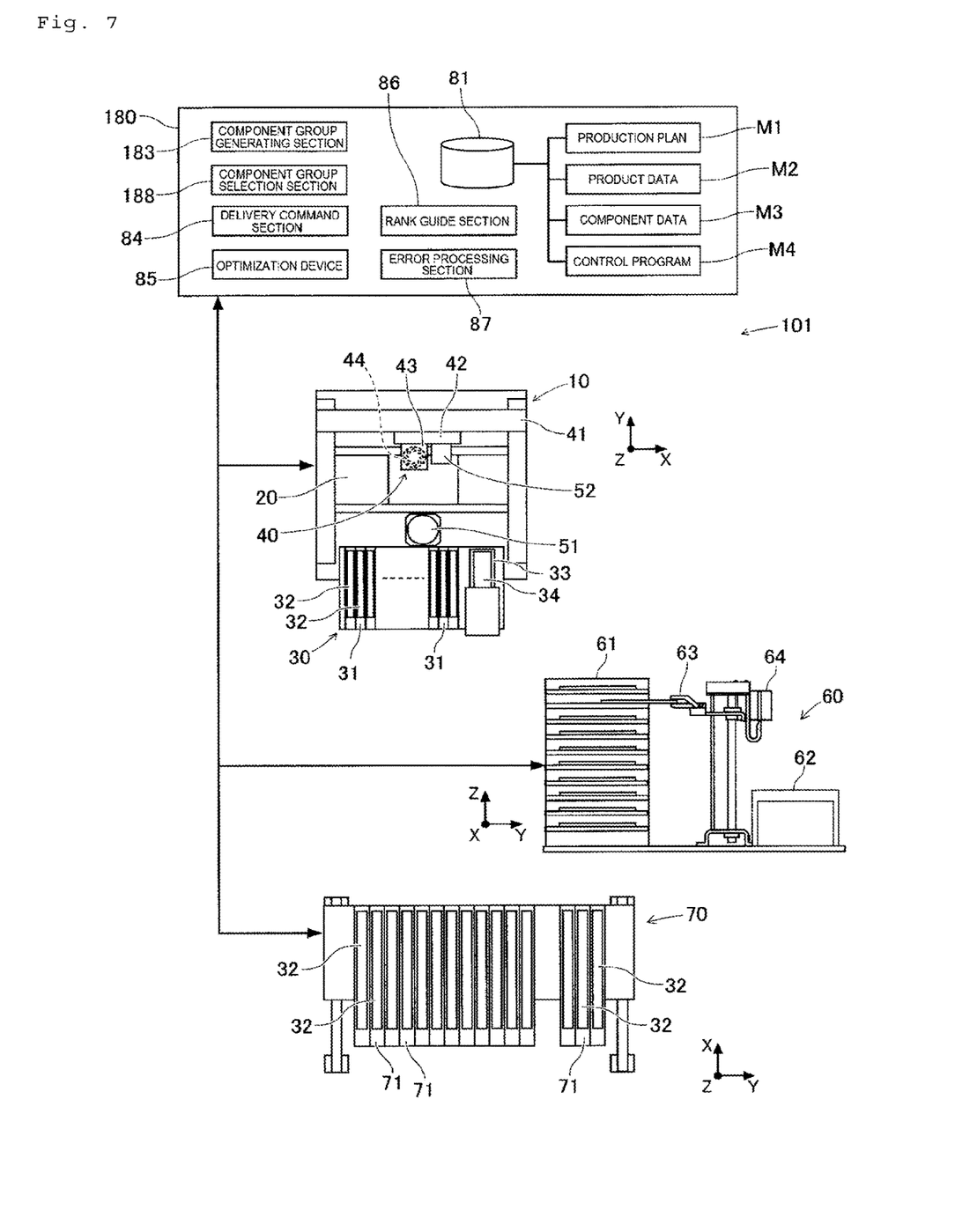
FIG. 7 is a plan view showing schematically a production system according to a modified embodiment.

Specifically speaking, production management apparatus 180 of production system 101 includes, as shown in FIG. 7, memory section 81, component group generating section 183, delivery command section 84, optimization processing section 85, rank guide section 86, error processing section 87, and component group selection section 188. Component group generating section 183 generates multiple component groups into each of which LED components 91 of multiple ranks are combined so as to satisfy a required specification of board product 90 based on the ranks of LED components 91 included in component data M3. At this time, component group generating section 183 generates multiple component groups for use in production of board product 90 so as to simply satisfy the required specification, irrespective of involving a designated rank.

Component group selection section 188 selects multiple component groups which are combined together for use in producing board product 90 based on a board product production capability of each of multiple component groups, which is calculated based on stock volumes of LED components 91 contained in component data M3, and a planned production volume of board product 90. To do this, component group selection section 188 may select multiple component groups so that the number of such multiple component groups which are combined together for use in producing board product 90 becomes minimal.

Figure 8:
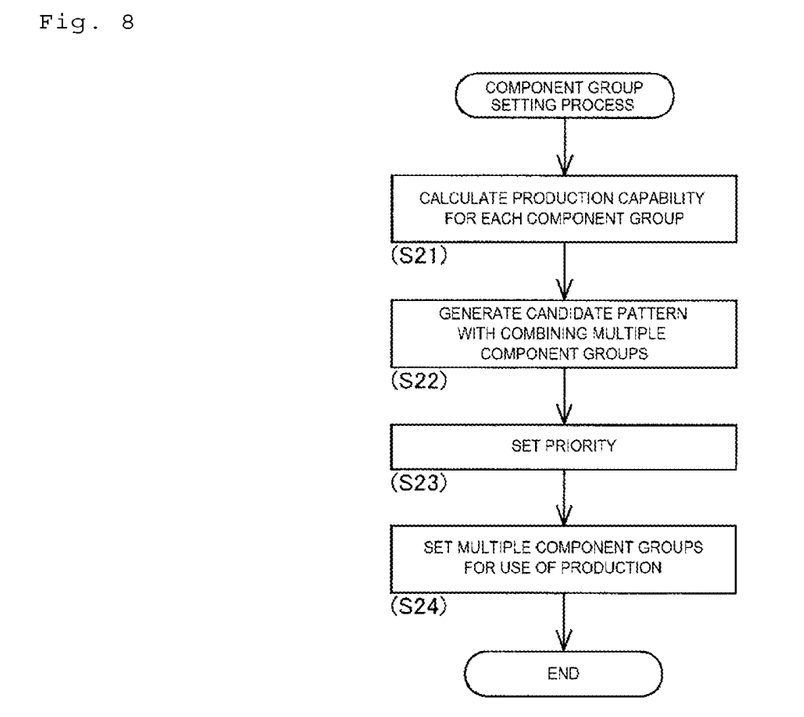
FIG. 8 is a flow chart showing a component group setting process.

More specifically, component group selection section 188 executes a component group setting process as shown in FIG. 8. Firstly, component group selection section 188 calculates a board product production capability of each of the multiple component groups so selected (S21). The board product production capability of each component group varies according to stock volumes of LED components 91 belonging to the component group in question. For example, in the case that LED components 91 belonging to one component group are of different ranks, in stock volumes of the LED components 91 of different ranks, a minimal stock volume determines a board product production capability of the component group in question.

Figure 9:
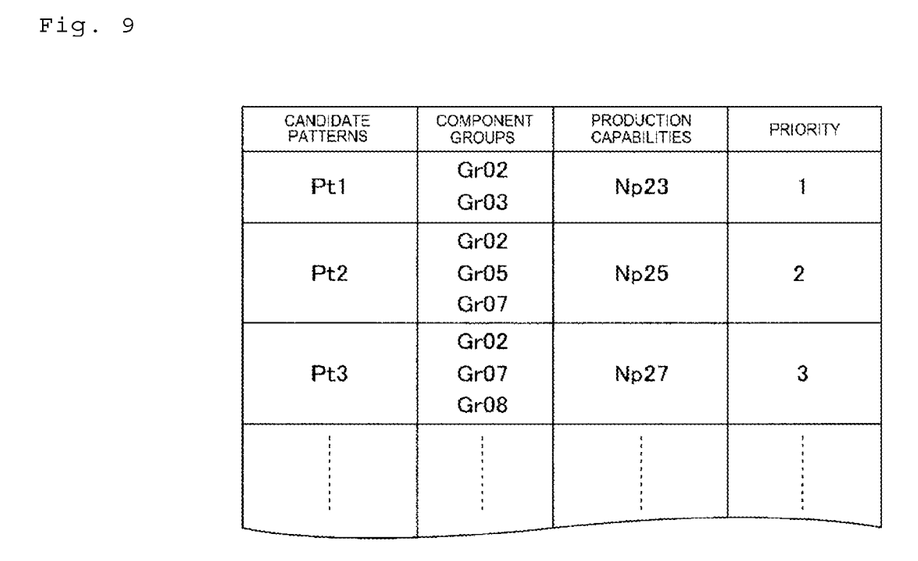
FIG. 9 is a chart depicting candidate patterns in which multiple component groups are combined together.

Next, component group selection section 188 generates candidate patterns (Pt1, Pt2, Pt3, . . . ) into each of which multiple component groups which can be used in producing board product 90 are combined, as shown in FIG. 9 (S22). The board product production capability of each candidate pattern is calculated based on corresponding component groups (Gr02, Gr03, . . . ). The board product production capability of the candidate pattern is calculated based on board product production capabilities of the component groups involved therein and whether ranks of LED components of the component groups do not overlap over the component groups. For example, in the case that ranks of LED components 91 belonging to component groups (Gr02, Gr03) making up candidate pattern Pt1 do not overlap over the relevant component groups, a sum of respective board product production capabilities of the component groups constitutes a board product production capability (Np01) of the relevant candidate pattern.

Following this, component group selection section 188 sets a priority applicable for each of multiple candidate patterns (S23). Here, component group selection unit 188 sets candidate pattern Pt1 as a highest priority in the order of priority so that the number of such multiple component groups which are combined together for use in producing board product 90 becomes minimal. In addition, as illustrated in the embodiment described before, component group selection section 188 may set priorities of candidate patterns for use for production based on the stock volume, stock ratio, expiry date of the LED components 91, the degree of averaging the stock volume after production, the preparatory setup workload, and the quality of board product 90.

Finally, component group selection section 188 sets multiple component groups (Gr02, Gr03) for use for production based on candidate pattern Pt1 of the highest priority (S24). With this configuration, multiple component groups can be used for producing board product 90, and for example, even in the event that there is a shortage of LED components 91 in any one of the multiple component groups for the reason associated with the stock volume of the relevant LED components, the production can still be continued. In addition, LED components 91 in stocker 60 can be used in a well-balanced manner. Consequently, production management apparatus 180 can achieve an improvement in production efficiency while enabling the production of board product 90 to be continued in a manner matching the current situations.

In addition, by adopting the process described above, in production of, for example, board product 90 of second product type U2, production management apparatus 180 determines, as shown in Table 2 in FIG. 3, that corresponding data BOM2 is used from a start of production to a production of an Mth board product and corresponding data BOM3 is used from a production of an M+1th board product to a completion of a planned production volume T2. Corresponding data BOM2, BOM3 correspond to the component groups (Gr02, Gr03) which make up candidate pattern Pt2. As a result, component mounting machine 10 can switch the ranks of LED components 91 which are to be mounted on a board by switching the corresponding data in the midst of a mounting process.

In the variation that has been described heretofore, error processing section 87 may not only execute an error process in starting a production but also execute an error process in a preparatory setup step. Specifically speaking, error processing section 87 executes an error process when other components than the multiple LED components belonging to the component groups (Gr02, Gr03) for use in producing board product 90 (hereinafter, referred to as "improper components") are associated with feeder 32 in a preparatory setup for production of board product 90 or when improper components are set in component mounting machine 10 for supply.

For example, when a reel ID is read in an attempt to load a predetermined carrier tape in feeder 32 at preparation carriage 70, production management apparatus 180 executes a collation to verify whether components stored on the carrier tape are LED components 91 to be set in component supply device 30. Then, if production management apparatus 180 determines that components different from LED components 91 to be set in component supply device 30 are attempted to be loaded in feeder 32, product management apparatus 180 causes error processing section 87 to issue a warning to the operator.

With this configuration, the error process is executed when there occurs an error in which improper components are associated with feeder 32 or set in component mounting machine 10 in a preparatory setup timing. This can prevent improper components not only from being erroneously set in component mounting machine 10 but also from being erroneously loaded in feeder 32. As a result, improper components can be prevented from being erroneously mounted on a board.

In addition, the configuration of the variation, in which the multiple component groups are generated for use in producing board products 90 of the same product type, can also be equally applied to the mode illustrated in the embodiment described before in which the component group is generated so as to include the designated rank. Furthermore, as illustrated in the embodiment and the variation thereof, in the case that production management apparatus 80, 180 include delivery command section 84 configured to inform stocker 60 of the identification information on LED components 91 belonging to one or more component groups for use for production and cause stocker 60 to execute the delivery process, a configuration may be adopted in which rank input section 82 and component group selection section 188 are omitted.

2-2. Delivery Process

In the embodiment, stocker 60 has the function of automatically receiving and delivering LED components 91 as described above and is of a type with a high level of automation. On the other hand, there is a stocker which does not have a function to convey LED components 91 between storage shelves 61 and working table 62 and which is of a type with a low level of automation. Delivery command section 84 may inform, as a guide, a storage position based on storage information as a delivery process, in the case that the automation level of the stocker is low. As a guide to the storage position described above, for example, a configuration may be adopted in which an indicator lamp is provided in a position corresponding to a position where a reel storing LED components 91 is disposed, so that a storage position of LED components 91 is indicated to the operator by illuminating the indicator lamp.

Additionally, there may be a case where production systems 1, 101 include an automatic conveyance device for conveying automatically LED components 91 between component mounting machine 10 and stocker 60. In this case, since a step is omitted in which the operator carries out LED components 91 from storage shelves 61 in stocker 60, rank guide section 86 may omit the process of displaying the ranks of LED components 91 on display device 64 of stocker 60.

2-3. Component Rows and Optimization Process

In the embodiment, one component row is described as being made up of four LED components 91, and the one component row is described as constituting one component group Gr. On the contrary to this, the production management process may be configured so as to deal with a case where one component group Gr includes multiple component rows. In addition, depending upon a positional relationship between adjacent component rows, there is a case where the adjacent component rows deviate less in color and brightness even though the mounting positions of multiple LED components 91 in those component rows are not always exchanged so that the ranks of LED components 91 differ in order row by row. In this case, the optimization may be omitted in which the mounting positions are rotated.

REFERENCE SIGNS LIST

1,101: Production system; 10: Component mounting machine; 30: Component supply device; 31: Slot; 32: Feeder; 33: Pallet; 34: Tray; 60: Stocker; 61: Storage shelves; 62: Working table; 63: Conveyance device; 64: Display device; 70: Preparation carriage; 71: Slot; 80, 180: Production management apparatus; 81: Memory section; 82: Rank input section; 83, 183: Component group generating section; 84: Delivery command section; 85: Optimization processing section; 86: Rank guide section; 87: Error processing section; 188: Component group selection section; 90: Board product; 91: LED component; 92: Power supply circuit; M1: Production plan; M2: Production data; M3: Component data; M4: Control program.

The invention claimed is:

1. A production management apparatus configured to manage a component mounting machine for producing a board product by mounting multiple LED components on a board and a stocker for storing multiple types of the LED components, the production management apparatus comprising:

a memory configured to memorize component data in which ranks of the LED components are associated with identification information of the LED components stored in the stocker, the ranks of the LED components are based on colors, brightness, and forward voltages of the LED components;

a rank input configured to accept the rank of a designated LED component in the LED components of the multiple types as a designated rank, the designated LED component being used in producing the board product; and a component group generator configured to generate, based on the ranks of the LED components included in the component data, a component group into which LED components with the designated rank are combined with the LED components of the multiple ranks so as to satisfy a required specification of the board product, wherein the production management apparatus further controls the component mounting machine to mount the component group generated by the component group generator onto the board product as a group to satisfy the required specification of the board product.

2. The production management apparatus according to claim 1, wherein when the designated LED component for use in producing the board product is designated, the rank input regards the rank of the LED component as one designated rank included in the designated rank.

3. The production management apparatus according to claim 1, wherein in a preparatory setup for production of the board product, when the designated LED component is associated with a feeder for use in supplying the designated LED component, or when the designated LED component is set in the component mounting machine for supply, the rank input regards the rank of the designated LED component as one designated rank included in the designated rank.

4. The production management apparatus according to claim 1,
wherein a stock volume and an expiry data of the LED components as well as the rank of the LED components are associated with the identification information, and
wherein when accepting a set stock volume, stock ratio, or expiry date of the designated LED component as a condition of the LED component prioritized for being used in producing the board product, the rank input regards the rank of the designated LED component of high priority which is indexed based on the component data as one designated rank included in the designated rank.

5. The production management apparatus according to claim 1,
wherein a stock volume of the LED components as well as the rank of the LED components are associated with the identification information,
wherein the component group generator generates, based on the ranks of the LED components included in the component data, multiple component groups into each of which LED components with the designated rank are combined with the LED components of the multiple ranks so as to satisfy the required specification of the board product, and
wherein the production management apparatus comprises further a component group selector configured to select multiple component groups from the multiple component groups so generated for combination for use in producing the board product based on a production capability of each of the multiple component groups so generated which is calculated based on stock volumes of the LED components included in the component data and a planned production volume of the board product.

6. The production management apparatus according to claim 5,
wherein the component group selector selects the multiple component groups so that the number of the multiple component groups for combination for use in producing the board product becomes minimal.

7. The production management apparatus according to claim 1,
wherein the production management apparatus further comprises a delivery commander configured to cause a delivery process of delivering the LED components to be executed in the stocker by informing the stocker of the identification information of the multiple LED components belonging to the component group generated by the component group generator for use in producing the board product.

8. The production management apparatus according to claim 7,
wherein the stocker comprises a storage shelves for storing the LED components, a working table for use in receiving and delivering the LED components from and to an outside location, and a conveyance device for conveying the LED components between the storage shelves and the working table, and
wherein when being informed of the identification information of the LED components to be delivered from the delivery commander, the stocker executes, as the delivery process, a process of conveying the LED components corresponding to the identification information from the storage shelves to the working table.

9. The production management apparatus according to claim 1,
wherein the component group generator generates the component group of the LED components of the multiple ranks so as to satisfy the required specification requiring a color, a brightness, and a voltage of a power supply circuit for applying a voltage to the multiple LED components of the board product to fall within permissible ranges therefor when the board product is in operation.

10. The production management apparatus according to claim 1,
wherein stock volumes and expiry dates of the LED components as well as the ranks thereof are associated with the identification information in the component data, and
wherein accepting a set stock volume, stock ratio, or expiry date of the designated LED component as a condition of the designated LED component prioritized for being used in producing the board product, the component group generator generates the component group so as to include therein the designated LED component of high priority which is indexed based on the component data.

11. The production management apparatus according to claim 1,
wherein the ranks and stock volumes of the LED components are associated with the identification information in the component data, and
wherein the component group generator generates the component group based on a planned production volume of the board product and the component data so that the stock volumes of the LED components in the stocker are averaged when the board product is produced to the planned production volume thereof.

12. The production management apparatus according to claim 1,
wherein the component group generator generates the component group so as to include LED components set in the component mounting machine for supply.

13. The production management apparatus according to claim 1,
wherein the component group generator generates the component group so as to satisfy the required specification of the board product and increase a quality of the board product which corresponds to a color, a brightness, and a voltage of a power supply circuit for applying a voltage to the multiple LED components of the board product when the board product is in operation.

14. The production management apparatus according to claim 1,
wherein the production management apparatus further comprises an optimization processor configured to optimize mounting positions, on the board, of the multiple LED components belonging to the component group generated by the component group generator for use in producing the board product based on the ranks of the multiple LED components.

15. The production management apparatus according to claim 14,
wherein the board product is made up by connecting component rows in parallel to each other or one another, each of the component rows including the LED components of the multiple ranks which are connected in series, and wherein the optimization processor executes the optimization by exchanging the mounting positions of the LED components in each of the multiple component rows.

16. The production management apparatus according to claim 15, wherein the optimization processor executes the optimization by exchanging the mounting positions in such a manner that the ranks of the multiple LED components in the adjacent component rows differ in order over the component rows.

17. The production management apparatus according to claim 1, wherein production management apparatus further comprises a rank guide configured to inform an operator who performs work relating to production of the board product of, as a guide, the ranks of the multiple LED components belonging to the component group generated by the component group generator for use in producing the board product.

18. The production management apparatus according to claim 1, wherein the production management apparatus further comprises an error processor configured to, when all the multiple LED components belonging to the component group for use in producing the board product are not set in the component mounting machine for supply in starting a production of the board product, prohibit the component mounting machine from mounting the LED components or inform an operator who performs work relating to production of the board product of a warning.

19. The production management apparatus according to claim 1, wherein the production management apparatus further comprises an error processor configured to, when components other than the multiple LED components belonging to the component group for use in producing the board product are associated with a feeder for use in supplying the components or the components other than the multiple LED components belonging to the component group are set in the component mounting machine for supply at a preparatory setup for production of the board product, prohibit the component mounting machine from mounting the LED components or inform an operator who performs work relating to production of the board product of a warning.

* * * * *